(12) United States Patent
Nunan et al.

(10) Patent No.: US 8,461,552 B2
(45) Date of Patent: Jun. 11, 2013

(54) ACTIVE PARTICLE TRAPPING FOR PROCESS CONTROL

(75) Inventors: Peter Nunan, Monte Sereno, CA (US);
Gregory Redinbo, Wenham, MA (US);
Julian Blake, Gloucester, MA (US);
Paul S. Buccos, Haverhill, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 194 days.

(21) Appl. No.: 12/943,694

(22) Filed: Nov. 10, 2010

(65) Prior Publication Data
US 2011/0049359 A1    Mar. 3, 2011

Related U.S. Application Data

(63) Continuation of application No. 11/646,155, filed on Dec. 27, 2006, now abandoned.

(51) Int. Cl.
*G21K 5/00* (2006.01)

(52) U.S. Cl.
USPC .............. 250/492.1; 250/492.2; 250/492.21

(58) Field of Classification Search
USPC ...................................... 250/492.1
See application file for complete search history.

(56) References Cited

U.S. PATENT DOCUMENTS

| | | | | |
|---|---|---|---|---|
| 4,560,871 A | * | 12/1985 | Bowman et al. | 250/288 |
| 5,449,920 A | * | 9/1995 | Chan | 250/492.21 |
| 5,656,092 A | * | 8/1997 | Blake et al. | 118/723 VE |
| 6,972,420 B2 | * | 12/2005 | Silverman | 250/492.2 |

* cited by examiner

*Primary Examiner* — Phillip A Johnston

(57) ABSTRACT

A particle isolation system includes a semiconductor process chamber; at least one member within the semiconductor process chamber wherein the member has at least a first position and a second position; and at least one isolation compartment having a plurality of walls, the isolation compartment defined by the plurality of walls, at least one of the plurality of walls of the isolation compartment defining at least one opening wherein the member in the first position permits particles to enter the isolation compartment from the semiconductor process chamber through the opening, and wherein the member in the second position substantially encloses the isolation compartment thereby substantially retaining the particles in the isolation compartment and substantially limiting movement of the particles between the semiconductor process chamber and the isolation compartment through the opening. An ion implant system is also provided.

20 Claims, 9 Drawing Sheets

ACTIVE PARTICLE TRAPPING FOR PROCESS CONTROL

CROSS-REFERENCE TO RELATED APPLICATIONS

This application is a continuation of U.S. patent application Ser. No. 11/646,155 entitled "Active Particle Trapping for Process Control," filed Dec. 27, 2006, the disclosure of which is hereby incorporated by reference.

FIELD

This invention relates to semiconductor manufacturing equipment and, more particularly, to a particle isolation system within semiconductor manufacturing equipment.

BACKGROUND

Ion implantation is a standard technique for introducing conductivity-altering impurities into semiconductor wafers. A desired impurity material is ionized in an ion source, the ions are accelerated to form an ion beam of prescribed energy, and the ion beam is directed at the surface of the wafer. The energetic ions in the beam penetrate into the bulk of the semiconductor material and are embedded into the crystalline lattice of the semiconductor material to form a region of desired conductivity.

An ion implanter includes an ion source for converting a gas or a solid material into a well-defined ion beam. The ion beam typically is mass analyzed to eliminate undesired ion species, accelerated to a desired energy, and implanted into a target. The ion beam may be distributed over the target area by electrostatic or magnetic beam scanning, by target movement, or by a combination of beam scanning and target movement. The ion beam may be a spot beam or a ribbon beam having a long dimension and a short dimension. The long dimension usually is at least as wide as the wafer. Examples of ion implanters may be found in, for example, U.S. Pat. No. 4,922,106 issued to Berrian et al. (assigned to Varian Semiconductor Equipment Associates, Inc. of Gloucester, Mass.) and U.S. Pat. No. 5,350,926 White et al., both of which are hereby incorporated by reference.

In a plasma doping system, a semiconductor wafer is placed on a conductive platen which functions as a cathode. The desired dopant material is introduced into the chamber, and a voltage pulse is applied between the platen and an anode or the chamber walls, causing formation of a plasma having a plasma sheath in the vicinity of the wafer. The applied voltage causes ions in the plasma to cross the plasma sheath and to be implanted into the wafer. The depth of implantation is related to the voltage applied between the wafer and the anode. An example of a plasma doping system may be found in, for example, U.S. Pat. No. 4,764,394 issued to Conrad, which is hereby incorporated by reference.

In other types of plasma systems, known as plasma immersion systems, a continuous RF voltage is applied between the platen and the anode, thus producing a continuous plasma. At intervals, a voltage pulse is applied between the platen and the anode, causing ions in the plasma to be accelerated toward the wafer. An example of a plasma immersion system may be found in, for example, U.S. Pat. No. 5,354,381 issued to Sheng, which is hereby incorporated by reference. Other types of deposition methods, such as chemical vapor deposition or physical vapor deposition also may be used in wafer or workpiece processing. Other semiconductor manufacturing methods, such as lithography, may likewise be used on a wafer or workpiece.

Workpiece processing equipment used for semiconductor manufacturing typically is under vacuum in a process chamber. During typical system operation for ion implantation, undesired particles may be formed or generated. These particles may be residual beam or plasma particles, photoresist, particles from a workpiece, or other particles that exist in regions of the process chamber and that may settle on a surface, base, or floor within a process chamber. Particles may, for example, break off a film formed on a surface within an analyzer magnet and settle to the base of that analyzer magnet process chamber.

During periodic maintenance, various process chambers used for semiconductor manufacturing may be open to the atmosphere or a process gas. The venting of such process chambers often leads to turbulent fluids being introduced to a process chamber. Particles that have settled on the floor, base, or other surfaces in a process chamber may then be disturbed or agitated and redistributed throughout the process chamber's interior. Due to additional cleaning required to remove these particles, re-qualifying the process chamber becomes more difficult and time consuming.

Prior particle isolation technology includes, for example, charged process chamber walls or charged plates or electrodes. This technology also may include mechanical means such as channels or fixed louvers. This technology also may include adhesive material or particle capturing material. However, these types of particle isolation technology may release trapped particles when a process chamber is vented and the particles are disturbed by turbulent fluids entering the process chamber. This may distribute the particles throughout the process chamber and may require additional cleaning to re-qualify the process chamber. These types of particle isolation technology also lack particle isolation devices that may be quickly removed.

Accordingly, there is a need in the art for a new and improved apparatus and method of particle isolation within semiconductor manufacturing process chambers.

SUMMARY

A particle isolation system that substantially retains particles in an isolation compartment and prevents or inhibits movement of particles between the isolation compartment and a semiconductor process chamber is provided.

In one embodiment, the particle isolation system includes a semiconductor process chamber; at least one member within the semiconductor process chamber wherein the member has at least a first position and a second position; and at least one isolation compartment having a plurality of walls, the isolation compartment defined by the plurality of walls, at least one of the plurality of walls of the isolation compartment defining at least one opening, wherein the member in the first position permits particles to enter the isolation compartment from the semiconductor process chamber through the opening, and wherein the member in the second position substantially encloses the isolation compartment thereby substantially retaining the particles in the isolation compartment and substantially limiting movement of the particles between the semiconductor process chamber and the isolation compartment through the opening.

In another embodiment, an ion implant system is provided. The ion implant system includes an ion source that directs ions toward a workpiece; a semiconductor process chamber; at least one member within the semiconductor process chamber wherein the member has at least a first position and a second position; and at least one isolation compartment having a plurality of walls, the isolation compartment defined by the plurality of walls, at least one of the plurality of walls of the isolation compartment defining at least one opening, wherein the member in the first position permits particles to enter the isolation compartment from the semiconductor process chamber through the opening, and wherein the member in the second position substantially encloses the isolation compartment thereby substantially retaining the particles in the isolation compartment and substantially limiting movement of the particles between the semiconductor process chamber and the isolation compartment through the opening.

BRIEF DESCRIPTION OF THE DRAWINGS

For a better understanding of the present disclosure, reference is made to the accompanying drawings, which are incorporated herein by reference and in which.

DETAILED DESCRIPTION

The invention is described herein in connection with an ion beam implantation apparatus. However, the invention can be used with other systems and processes involved in semiconductor manufacturing such as, for example, plasma doping or immersion, physical vapor deposition, chemical vapor deposition, or lithography. Thus, the invention is not limited to the specific embodiments described below.

Figure 1:
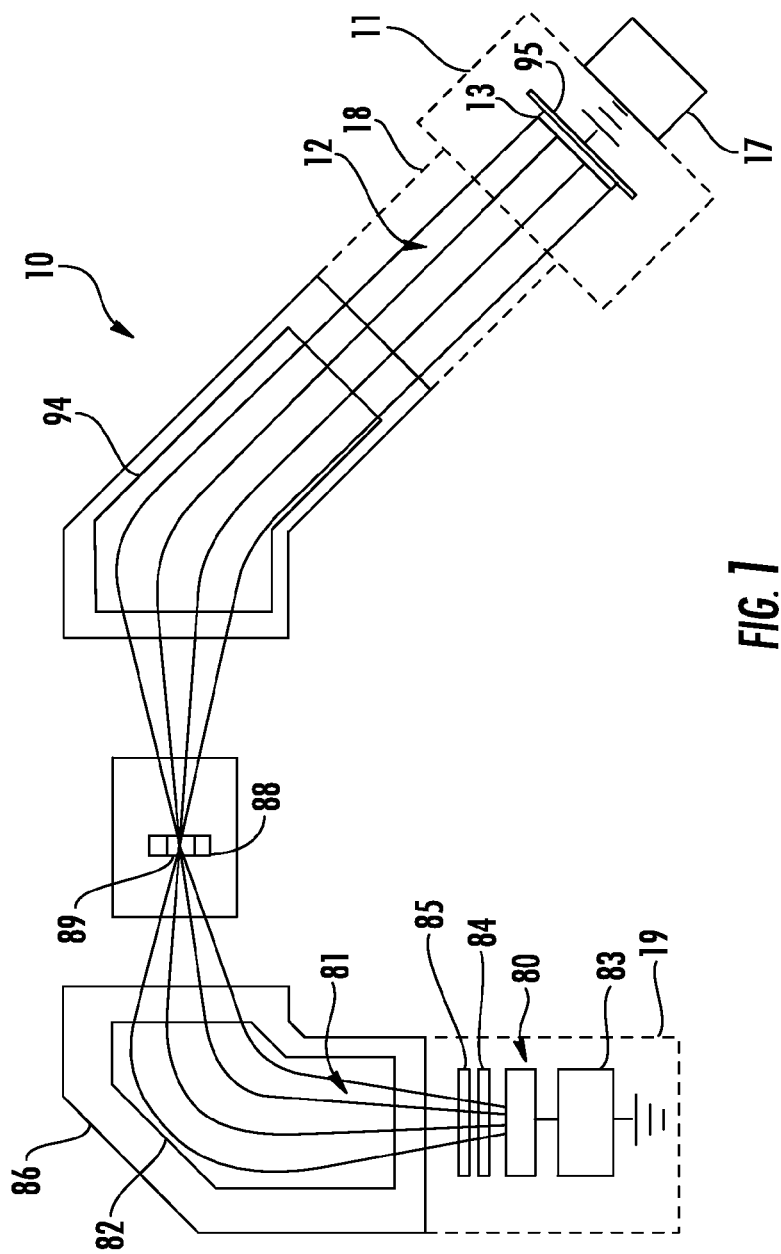
FIG. 1 is a diagram of a typical ion implanter suitable for implementing a particle isolation system.

FIG. 1 is a diagram of a typical ion implanter suitable for implementing a particle isolation system of the present invention. Those skilled in the art will recognize other ion implanter designs or semiconductor manufacturing technology that also may incorporate the present invention.

In general, ion implanter 10 includes ion source 80 to generate ions that form ion beam 81. Ion source 80 may include an ion chamber and a gas box containing a gas to be ionized. The gas is supplied to the ion chamber where it is ionized. The ions thus formed are extracted from the ion chamber to form ion. beam 81. Ion beam 81 is directed between the poles of resolving magnet 82. A first power supply 83 is connected to an extraction electrode of ion source 80 and provides a positive first voltage $V_0$. First voltage $V_0$ may be adjustable, for example, from about 0.2 to about 80 kV in a high current ion implanter. Thus, ions from ion source 80 are accelerated to energies of about 0.2 to 80 keV by the first voltage $V_0$.

Ion beam 81 passes through suppression electrode 84 and ground electrode 85 to mass analyzer 86. Mass analyzer 86 includes resolving magnet 82 and masking electrode 88 having resolving aperture 89. Resolving magnet 82 deflects ions in ion beam 81 such that ions of a desired ion species pass through resolving aperture 89. Undesired ion species do not pass through resolving aperture 89, but are blocked by masking electrode 88. In one embodiment, resolving magnet 82 deflects ions of the desired species by about 90°.

Ions of the desired ion species pass through resolving aperture 89 to angle corrector magnet 94. Angle corrector magnet 94 deflects ions of the desired ion species and converts the ion beam from a diverging ion beam to ribbon ion beam 12, which has substantially parallel ion trajectories. In one embodiment, angle corrector magnet 94 deflects ions of the desired ion species by about 70°. In another embodiment, ions of the desired ion species may pass through a deceleration stage.

End station 11 supports one or more workpieces, such as wafer 13, in the path of ribbon ion beam 12 such that ions of the desired species are implanted into wafer 13. End station 11 may include platen 95 to support wafer 13. End station 11 also may include a scanner (not shown) for moving wafer 13 perpendicular to the long dimension of the ribbon ion beam 12 cross-section, thereby distributing ions over the entire surface of wafer 13. Ribbon ion beam 12 preferably is at least as wide as wafer 13. Although ribbon ion beam 12 is illustrated, other ion implanter embodiments may provide a scanned ion beam (scanned in one or two dimensions) or may provide a fixed or spot ion beam. The ion implanter may further include a second deceleration stage in some embodiments.

The ion implanter may include additional components known to those skilled in the art. For example, end station 11 typically includes automated workpiece handling equipment for introducing workpieces into the ion implanter and for removing workpieces after ion implantation. End station 11 also may include a dose measuring system, an electron flood gun, or other known components. It will be understood to those skilled in the art that the entire path traversed by the ion beam is evacuated during ion implantation.

A process chamber, such as, for example, a semiconductor process chamber, may be any enclosed space in a piece of semiconductor manufacturing equipment. Embodiments of the current particle isolation system may be used in various process chambers in an ion implanter, such as one illustrated in FIG. 1. These may include, for example, ion beam generator chamber 19, beam line chamber 18, mass analyzer 86, angle corrector magnet 94, end station 11, load lock chamber 17, or other devices used in on implantation requiring particle isolation. It is understood to those skilled in the art that many process chambers typically are operated at a vacuum. However, the current particle isolation system in accordance with the present invention may be used in non-vacuum process chambers.

Figure 2:
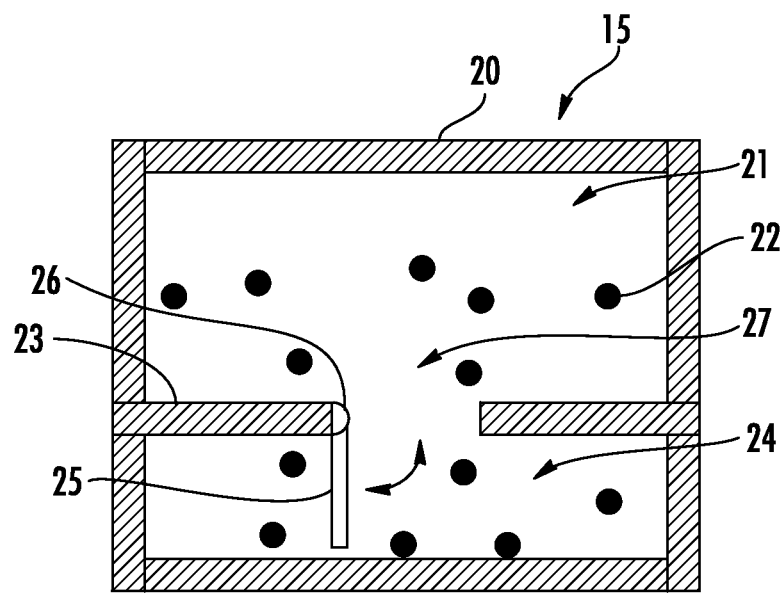
FIG. 2 is a view of an embodiment of a member in a chamber having a particle isolation system in a first position.

FIG. 2 is a view of an embodiment of a member in a chamber having a particle isolation system in a first, or open, position. Particles 22 are found within chamber 21 and on walls 20 of process chamber 15, and enter isolation compartment 24 through opening 27. Isolation compartment 24 has a plurality of walls and may be of any shape that accommodates particles 22.

Process chamber 15 includes at least one surface 23 that defines at least one opening 27. In this embodiment, isolation compartment 24 is separated from chamber 21 by surface 23. Surface 23 has, in this particular embodiment, one opening 27.

Disposed on surface 23 is hinge 26, upon which member 25 is mounted. Hinge 26 may be capable of full 360° rotation, or may be limited to a certain angle of rotation between a first position, open, and second position, closed. Member 25 is not limited to being disposed on hinge 26 and also may be positioned in, or be translated between a first and second position to substantially retain particles 22 in isolation compartment 24 using other means such as, for example, tracks, slides, pins, rods, or other means or methods known to those skilled in the art. In some embodiments, member 25 may be composed of materials that resist particles 22 from attaching to member 25.

In this particular embodiment, member 25 is a flat panel configured to be received by opening 27 in order to prevent movement by particles 22 between chamber 21 and isolation compartment 24. Member 25 may, of course, have other curvatures or shapes. Member 25 is shown in a first position in FIG. 2, but need not be at a 90° angle to surface 23 in its first position. The first position of member 25 may be any angle that permits particles 22 to enter isolation compartment 24. In moving from the illustrated first position to the second position, member 25 may move along the path illustrated by the arrow in FIG. 2. Member 25 may have positions other than a first and second position relative to obtaining or substantially retaining particles 22 in isolation compartment 24. These positions may be within isolation compartment 24, as seen in FIG. 2, or opposite or outside of isolation compartment 24.

When member 25 is in its second, or closed, position, which is substantially parallel with surface 23 in this particular embodiment, movement of particles 22 through opening 27 between isolation compartment 24 and chamber 21 is prevented. In this particular embodiment, member 25 is configured to be received by opening 27 and member 25 fills opening 27. A perfect seal between member 25 and surface 23 within opening 27 may be present, or member 25 may fit tightly enough within opening 27 to prevent significant movement of particles 22 through opening 27 between isolation compartment 24 and chamber 21.

In another embodiment, member 25 is configured to cover opening 27 and may be substantially parallel with surface 23 in its second position. Member 25 may have a larger surface area than the area of opening 27. Member 25 may have larger dimensions on all non-hinge sides than the corresponding dimensions of opening 27, or just on the side of opening 27 opposite of hinge 26. A perfect seal between member 25 and surface 23 may be present, or member 25 may fit tightly enough around opening 27 to prevent significant movement of particles 22 between isolation compartment 24 and chamber 21 through opening 27.

In yet another embodiment, a plurality of members 25 is used in a single opening 27. This plurality of members 25 may be disposed opposite of one another across opening 27. A plurality of members 25 may be used due to the size of opening 27, or other reasons.

Figure 3:
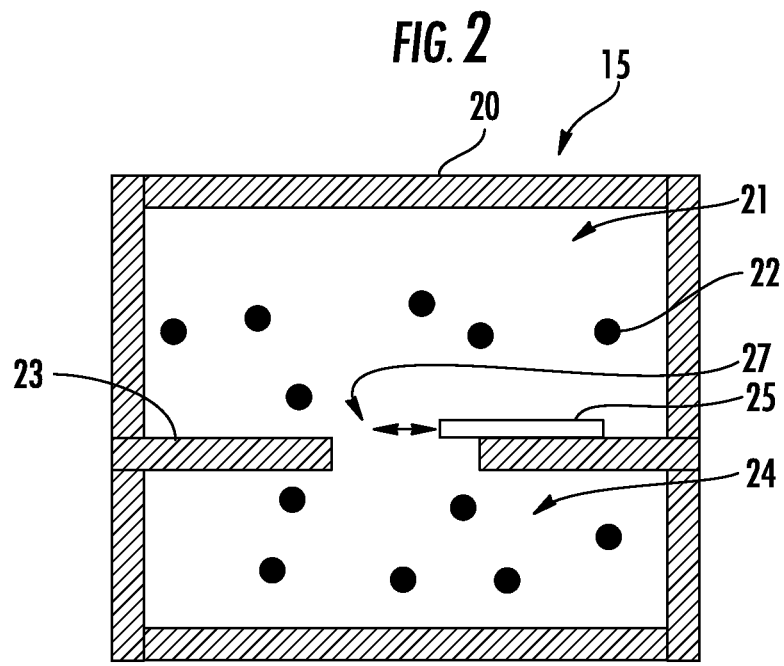
FIG. 3 is a view of another embodiment of a member in a chamber having a particle isolation system in a first position.

FIG. 3 illustrates a view of another embodiment of a member in a chamber having a particle isolation system in a first position. Particles 22 are found within chamber 21 and on walls 20 of process chamber 15, and enter isolation compartment 24 through opening 27. In this embodiment, isolation compartment 24 is separated from chamber 21 by surface 23 of process chamber 15. Surface 23 has, in this particular embodiment, one opening 27.

In this particular embodiment, member 25 is disposed on surface 23 and is configured to move. Member 25 may use a track or channel to translate between at least a first position and second position, a pin or rod to rotate around, or other actuated means known to those skilled in the art to translate between at least a first position to a second position. Member 25 may be disposed on surface 23, but also may be disposed under surface 23 nearer to isolation compartment 24, or may be disposed within surface 23. Member 23 moves from a first position to a second position in the direction of the arrow illustrated in FIG. 3. The first position may be any position that allows particles 22 to substantially move through opening 27. Multiple positions may be used and member 22 is not limited solely to a first and second position in this embodiment.

When member 25 is in its second position, movement of particles 22 through opening 27 between isolation compartment 24 and chamber 21 is substantially prevented or inhibited. Isolation compartment 24 may be substantially enclosed when member 25 is in its second position. In this particular embodiment, member 25 is configured to be cover opening 27 and may be substantially parallel with surface 23 in its second position. Member 25 may have a larger surface area than the area of opening 27. A perfect seal between member 25 and surface 23 may be present, or member 25 may fit tightly enough around opening 27 to prevent or inhibit significant movement of particles 22 between isolation compartment 24 and chamber 21 through opening 27.

Figures 4, 5:
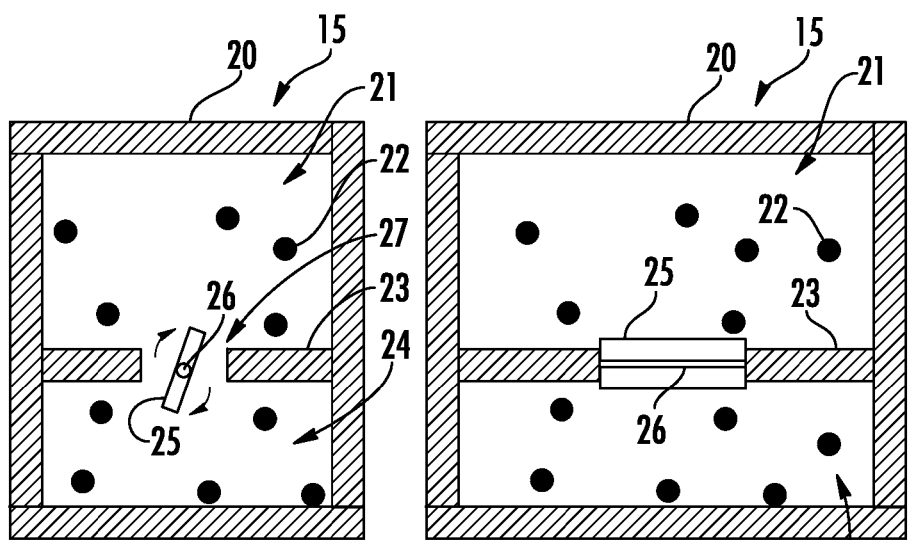
FIG. 4 is a view of another embodiment of a member in a chamber having a particle isolation system in a first position.
FIG. 5 is another view of the embodiment of FIG. 4.

FIG. 4 is a view of another embodiment of a member in a chamber having a particle isolation system in a first position. Particles 22 are found within chamber 21 and on walls 20 of process chamber 15, and enter isolation compartment 24 through opening 27. In this embodiment, isolation compartment 24 is separated from chamber 21 by surface 23 of process chamber 15. Surface 23 has, in this particular embodiment, one opening 27. Member 25 is mounted upon hinge 26. Member 25 in this embodiment comprises a flat slat, however, member 25 also may comprise a curved slat, a plurality of slats, or a propeller shape with a plurality of arms, as examples, and is not limited to merely being a single flat slat.

Hinge 26 is mounted on the center of member 25 in this embodiment, allowing member 25 to pivot about an axis in a rotational manner indicated by the arrows in FIG. 4, rather than pivoting as a lever as seen in FIG. 2. Member 25 is illustrated in a first position in FIG. 4. However, member 25 may rotate about hinge 26 and is not limited to having at first position as illustrated in FIG. 4 or a first position substantially perpendicular to opening 27. The first position in this embodiment may be any angle that allows the movement of particles 22 through opening 27 between chamber 21 and isolation compartment 24. Member 25 may rotate clockwise as indicated by the arrows in FIG. 4, or may rotate counterclockwise. Member 25 may be able to rotate 360° or may be limited to rotating less than 360°.

In another embodiment, hinge 26 also may be mounted substantially off-center from the center of member 25, allowing member 25 to pivot about an axis in a rotational manner. Substantially off-center means that hinge 26 is not centered as seen in FIG. 4 and that hinge 26 is spaced substantially not equidistant between the two ends of member 25. Thus, if member 25 were bifurcated by hinge 26, the surface areas of the two bifurcated sides of member 25 would be different.

In another embodiment, member 25 also may be longer in width than the width of opening 27. In this particular embodiment, member 25 in its second position may block movement of particles 22 through opening 27 between isolation compartment 24 and chamber 21 while as substantially parallel with surface 23 as is mechanically feasible to fill or cover opening 27. A perfect seal between member 25 and surface 23 may be present, or member 25 may fit tightly enough within opening 27 to prevent or inhibit significant movement of particles 22 between isolation compartment 24 and chamber 21 through opening 27.

FIG. 5 shows another view of the embodiment of FIG. 4. FIG. 5 is a view of member 25 of FIG. 4 from a different perspective. Hinge 26 is disposed on surface 23. Member 25 has hinge 26 mounted in its center, allowing rotational movement about hinge 26. Hinge 26 is not limited to bifurcation of the entire length of member 25, but may instead be disposed on only the ends of member 25.

Figure 6:
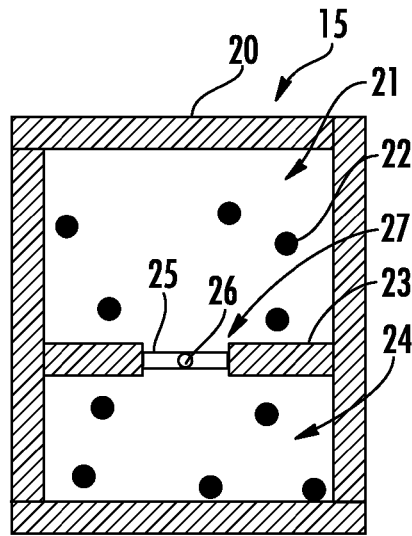
FIG. 6 is another view of the embodiment of the member of FIG. 4 in a second position.

FIG. 6 is another view of the embodiment of the member of FIG. 4 in a second position. FIG. 6 corresponds to FIG. 4. Member 25 is now in its second position and movement of particles 22 through opening 27 between isolation compartment 24 and chamber 21 is substantially prevented or inhibited. Isolation compartment 24 may be substantially enclosed when member 25 is in its second position. In this particular embodiment, member 25 is configured to be received by opening 27. When in its second position, which may be substantially parallel with surface 23, member 25 fills opening 27. A perfect seal between member 25 and surface 23 may be present, or member 25 may fit tightly enough within opening 27 to prevent or inhibit significant movement of particles 22 between isolation compartment 24 and chamber 21 through opening 27.

Figure 7:
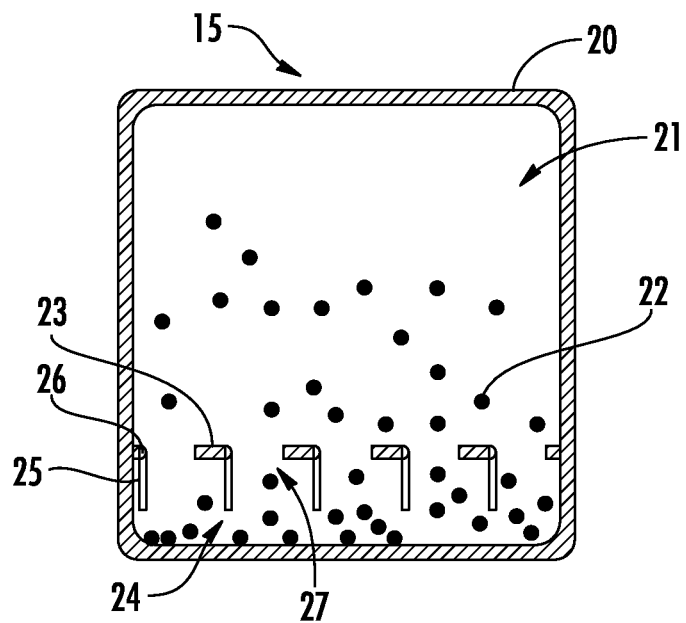
FIG. 7 is a view of a chamber incorporating a particle isolation system in a first position.

FIG. 7 is a view of a chamber incorporating a particle isolation system in a first position. Process chamber 15 has walls 20 and surface 23 defining chamber 21. Surface 23 may be part of process chamber 15, or may be a separate surface disposed within process chamber 15. Process chamber 15 also has particles 22 within chamber 21. Particles 22 may be may be residual beam particles, photoresist, or other particles that exist in various parts of process chamber 15 and which may fall or deposit onto surfaces in process chamber 15.

For example, ions from an ion beam that do not strike a workpiece may instead strike walls 20 of process chamber 15 and form a film. Portions of this film may break off and form particles 22. Furthermore, an ion beam may deposit ions on walls 20 of process chamber 15 or within isolation compartment 24 through opening 27 if process chamber 15 is located near or around an analyzer magnet or similar device. Particles 22 also may be formed from the plasma during plasma doping, be introduced to process chamber 15 with an unclean workpiece, be formed from the components of process chamber 15 during operation, be introduced through venting process chamber 15 with a fluid, be introduced by opening process chamber 15 to atmosphere, or be introduced or generated by other means or sources.

Some particles 22 within process chamber 15 may eventually settle toward the base of process chamber 15, in this embodiment surface 23. Some particles 22 may have velocity and bounce off walls 20 of process chamber 15. Lastly, some particles 22, such as those from an ion beam, for example, may have a charge and be subjected to electrostatic forces during their movement and settling in process chamber 15. When member 25 is in a first, or open, position, particles 22 may settle or move through opening 27 into isolation compartment 24.

Within chamber 21, isolation compartment 24 is provided to substantially retain particles 22. The openings 27 of process chamber 15 may be spaced, for example, equally around a surface of process chamber 15, or in specific regions of process chamber 15 to substantially retain particles 22. Process chamber 15 is not limited to this particular embodiment with multiple openings 27 and may instead only have a single opening 27, as seen in FIG. 2.

Member 25 may be in, on, or around surface 23, and may be configured to be received by opening 27, to block opening 27, to cover opening 27, or to occlude opening 27. Process chamber 15 may include just one member, as illustrated in FIG. 2, or may include a plurality of members as illustrated in 7. Having a plurality of members may lower efficiency of isolation compartment 24, but may be desired to accommodate an opening 27 in a small area of process chamber 15 or to place an opening 27 near a particle source within process chamber 15, as examples.

Figure 8:
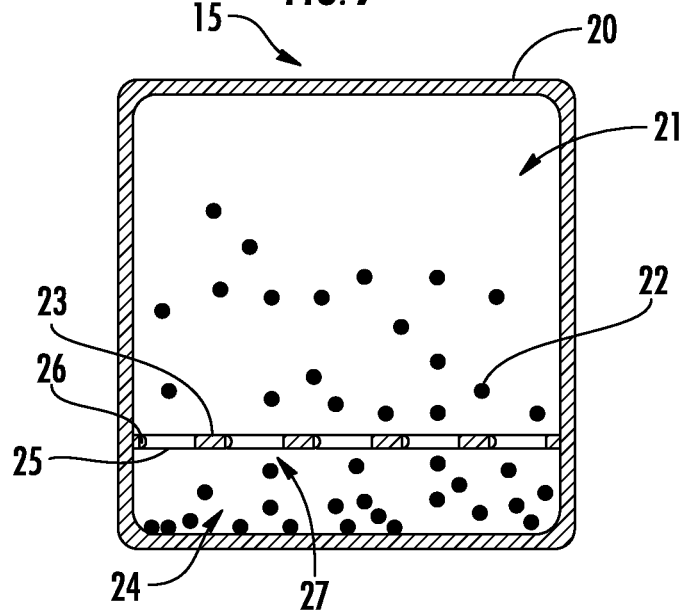
FIG. 8 is a view of the particle isolation system of FIG. 7 in a second position.

FIG. 8 illustrates a view of the particle isolation system of FIG. 7 in a second position. While leaving member 25 predominantly in the first, or open, position of FIG. 7 may allow a maximum amount of particles 22 to enter or settle into isolation compartment 24, each member 25 may be moved from a first position, open, to a second position, closed. Member 25 may wholly or partially fill, occlude, block, or cover opening 27 in this second position provided particles 22 are substantially retained in isolation compartment 24. In FIG. 8, member 25 substantially retains particles 22 by moving to a second position substantially parallel with opening 27 and surface 23. However, member 25 may have second positions not substantially parallel with opening 27 and surface 23 that still substantially retain particles 22 in isolation compartment 24, and member 25 is thus not limited to being solely parallel with opening 27 and surface 23 when in a second position.

When substantially all of member 25 are moved to a second position, as illustrated by FIG. 8, particles 22 are substantially retained within isolation compartment 24. Most particles 22 may no longer move to chamber 21 of process chamber 15 from isolation compartment 24. However, member 22 also may move to a second position different from that illustrated in this embodiment to substantially retain particles 22 in isolation compartment 24.

Each member 25 may be moved to a second position, for example, while process chamber 15 is vented. This venting may be done by opening process chamber 15 to atmosphere or inserting a fluid into process chamber 15. If process chamber 15 is vented, particles 22 may no longer remain settled on wall 20 or in isolation compartment 24, but rather may be stirred up within chamber 21. This increases the difficulty in cleaning process chamber 15. Thus, moving member 25 to a second position will substantially retain particles 22 in isolation compartment 24 and substantially prevent particles 22 from being stirred up within chamber 21.

Figure 16:
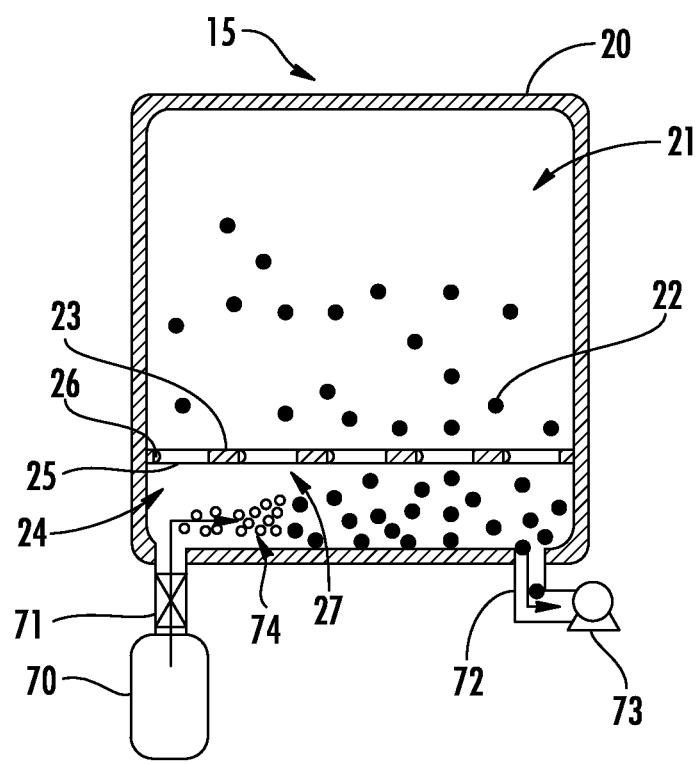
FIG. 16 is a view of an embodiment of the particle isolation system using an evacuation system.

Once particles 22 settle or fall into and are substantially retained in isolation compartment 24, particles 22 may remain there until removed or cleaned out. This may be during preventative maintenance, which may occur, for example, weekly, monthly, or at other times. A user may clean isolation compartment 24 using, for example, a wet clean or abrasive clean. Other methods of removal known in the art during operation, such as using a vent and rough, or autoclean, routine, also may be used. This example of a removal method is illustrated in FIG. 16.

Figure 9:
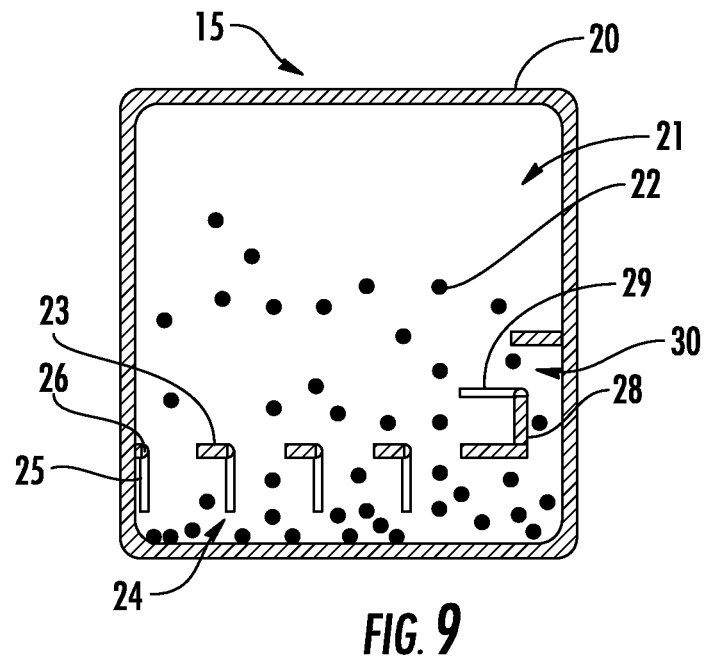
FIG. 9 is a view of an embodiment of a chamber incorporating a particle isolation system in a first position.

FIG. 9 shows a view of an embodiment of a chamber incorporating a particle isolation system in a first position. Process chamber 15 includes particles 22 in chamber 21. Process chamber 15 further includes at least one surface 23 and at least one hinge 26 on which at least one member 25 is disposed.

Figure 10:
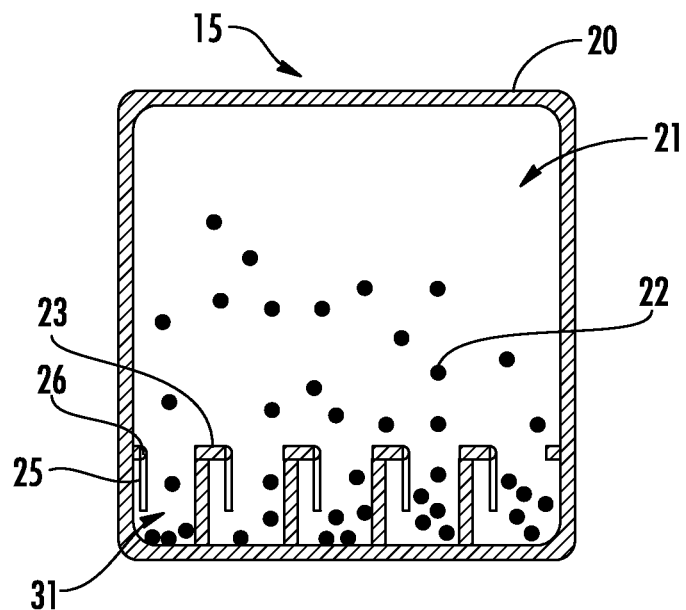
FIG. 10 is a view of another embodiment of a chamber incorporating a particle isolation system in a first position.

Process chamber 15 in this particular embodiment also includes a second surface 28. Second surface 28 may be found anywhere within process chamber 15, but here is illustrated on a side of process chamber 15. Second surface 28 may be part of process chamber 15, or may be a separate surface disposed within process chamber 15. Second surface 28 includes at least one second surface opening 30 in which at least one second surface member 29 operates. In this embodiment, one isolation compartment 24 is utilized, however member 25 and second surface member 29 may have two or more separate isolation compartment 24, as illustrated in FIG. 10. Process chamber 15 also may have more than one second surface 28.

Adding a second surface opening 30 and second surface member 29 assists in collecting particles 22 that come from a known particle producing source. Second surface opening 30 and second surface member 29 also may assist in collecting particles 22 when positioned where particles 22 will break off from a film formed from an ion beam striking a process chamber surface, among other reasons.

FIG. 10 is a view of another embodiment of a chamber incorporating a particle isolation system in a first position. Process chamber 15 includes particles 22 in chamber 21. Process chamber 15 further includes surface 23, at least one hinge 26 on which at least one member 25 is disposed. Process chamber 15 also includes sectional isolation compartments 31. Sectional isolation compartments 31 may correspond to each member 25, but also may include multiple members 25 per sectional isolation compartment 31.

Sectional isolation compartments 31 may be found at the base of chamber 21, but also may be found in other regions of process chamber 15. Sectional isolation compartments 31 may be of different sizes to fit underneath specific process equipment or to be accommodated within different regions of process chamber 15, but also may be of uniform size. If process chamber 15 has multiple small members 25 coupled with sectional isolation compartments 31, efficiency may be reduced, but this may he desired due to shape, contents, or particle sources of process chamber 15, as examples.

Figure 11:
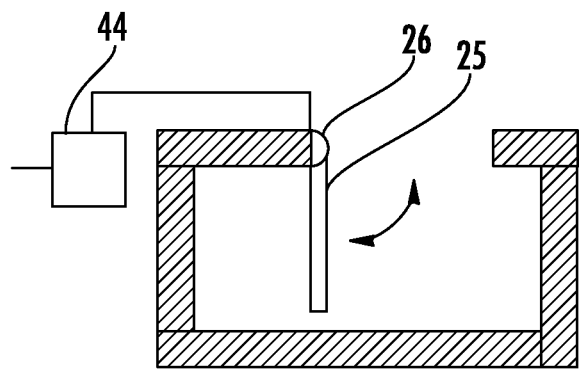
FIG. 11 is a view of an embodiment of the particle isolation system using an electro-mechanical actuator.

FIG. 11 is a view of an embodiment of the particle isolation system using an electro-mechanical actuator. Electro-mechanical actuator 44 has a motor that powers a gear train. Electro-mechanical actuator 44 also has an electrical feed. Electro-mechanical actuator 44 may provide the motion to member 25 through hinge 26 in response to a signal. Electro-mechanical actuator 44 may provide motion to member 25 through other means than hinge 26. Thus, member 25 moves between first and second positions due to electro-mechanical actuator 44.

Figure 12:
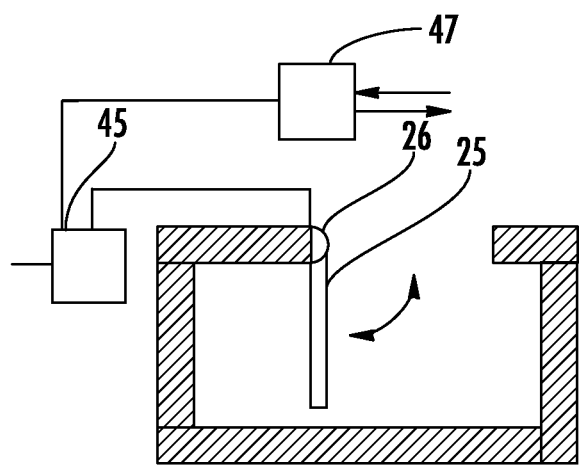
FIG. 12 is a view of the particle isolation system using a pneumatic actuator.

FIG. 12 is a view of the particle isolation system using a pneumatic actuator. Pneumatic actuator 45 may be a pneumatic actuator, or some other pneumatically-powered drive that converts energy in the form of a fluid into motion. Motion in pneumatic actuator 45 may be rotary, linear, or a combination of both rotary and linear. Pneumatic actuator 45 may power and provide the motion to member 25 through hinge 26. Pneumatic actuator 45 may provide motion to member 25 through other means than hinge 26. Thus, member 25 moves between first and second positions due to pneumatic actuator 45. Pneumatic actuator 45 may have pneumatic source 47 providing gas or liquid to power pneumatic actuator 45.

Figure 13:
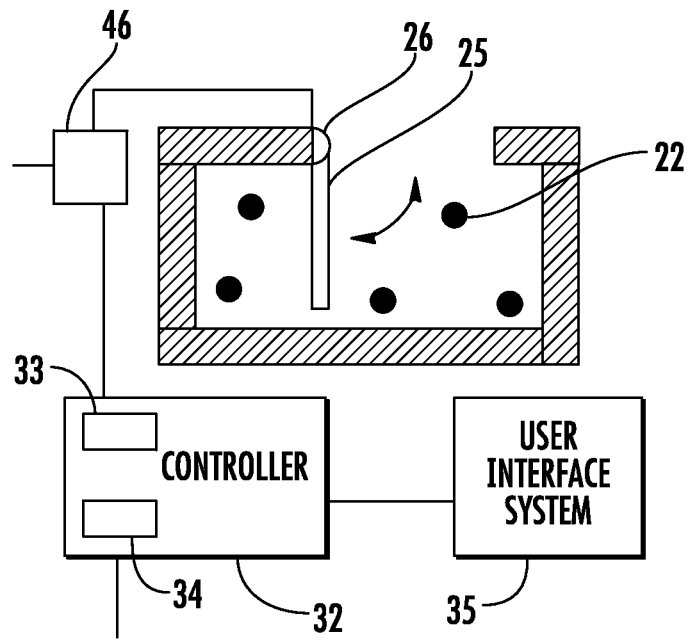
FIG. 13 is a view of an embodiment of the particle isolation system using a controller.

FIG. 13 is a view of an embodiment of the particle isolation system using a controller. Controller 32 is the control system for a piece of semiconductor manufacturing equipment, such as an ion implanter. Controller 32 includes a general-purpose computer or network of general-purpose computers that may be programmed to perform the desired input/output functions. Controller 32 may include processor 33 and machine readable medium 34. Processor 33 may include one or more processors known in the art such as, for example, those commercially available from Intel Corporation. Machine readable medium 34 may include one or more machine readable storage media, such as random-access memory (RAM), dynamic RAM (DRAM), magnetic disk (e.g., floppy disk and hard drive), optical disk (e.g., CD-ROM), and/or any other device that can store instructions for execution. Controller 32 can also include other electronic circuitry or components, such as, but not limited to, application specific integrated circuits, other hardwired or programmable electronic devices, or discrete element circuits. Controller 32 also may include communication devices. Controller 32 may receive input data and instructions from any variety of systems and components of a piece of semiconductor manufacturing equipment and may provide output signals to control the components of that piece of semiconductor manufacturing equipment.

Controller 32 may be able to communicate with drive 46, whether drive 46 is a pneumatic actuator, electro-mechanical actuator, piezo actuator, or other form of actuator that can move member 25 between at least a first and second position.

Controller 32 may be aware when an ion implanter is going to vent, for example, and may communicate with drive 46 to move member 25 to a second position, substantially retaining particles 22 at that time. Controller 32 also may communicate with drive 46 to move member 25 to a second position for other reasons, such as, for example, user command or the occurrence of preventative maintenance. If there is a plurality of members 25, then controller 32 may move only sonic of members 25 between a first and second position.

The particle isolation system also may include a user interface system 35. User interface system 35 may include, but not be limited to, devices such as touch screens, keyboards, user pointing devices, displays, or printers to allow a user to input commands, data, or to monitor the semiconductor manufacturing equipment. User interface system 35 may be located on-site with the ion implanter or may be done remotely via local computer networks.

Figure 14:
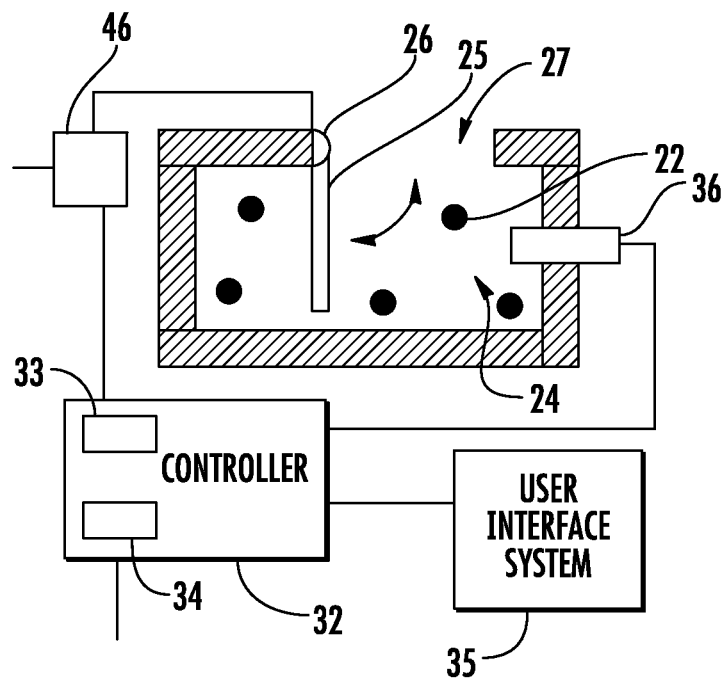
FIG. 14 is a view of another embodiment of the particle isolation system using a particle monitor.

FIG. 14 is a view of another embodiment of the particle isolation system using a particle monitor. Controller 32 may be able to communicate with drive 46. Controller 32 also may be able to communicate with particle monitor 36. Particle monitor 36 may be an in-situ particle monitor or another type of device known to those skilled in the art that measures particle count or particle levels within isolation compartment 24. Particle monitor 36 also may measure the particle count in other parts of a process chamber and is not limited to measuring particle count only in isolation compartment 24. Particle monitor 36 may not only measure particles 22, but may instead measure other particles or fluids in a process chamber.

Controller 32 may communicate with particle monitor 36 in real-time, intermittently, or based on some event. These events may be, as examples, the input of new workpieces into a process chamber, the number of workpieces processed, or the set-up of an ion beam or plasma. Particle monitor 36 also may communicate with controller 32 that the number of particles 22 in isolation compartment 24 has exceeded a threshold. This threshold may vary based on the application or process used in the ion implanter. When particle monitor 36 communicates with controller 32 that the threshold for particles 22 has been exceeded, in this embodiment controller 32 communicates with drive 46 to move member 25 from a first position to a second position. Drive 46 may move member 25 from a first position to a second position as illustrated by the arrow in FIG. 14, thereby substantially isolating and substantially retaining particles 22 in isolation compartment 24.

Particles 22 will remain substantially retained in isolation compartment 24 until particles 22 are removed during preventative maintenance or some other cleaning occurs. This process substantially prevents or inhibits particles 22 in isolation compartment 24 from escaping if isolation compartment 24 is substantially full or beyond the set threshold, but also may prevent leaving member 25 in a first position when no more particles 22 could enter isolation compartment 24 because isolation compartment 24 is full or beyond the set threshold.

Figure 15:
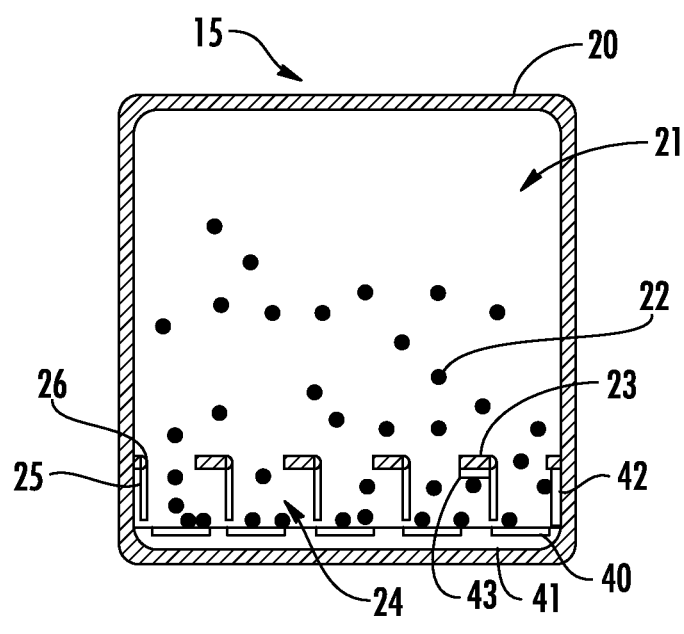
FIG. 15 is a view of another embodiment of a chamber incorporating a particle isolation system in a first position and particle isolators.

FIG. 15 shows a view of another embodiment of a chamber incorporating a particle isolation system in a first position and particle isolators. Process chamber 15 includes particles 22 in chamber 21. Process chamber 15 further includes surface 23 and at least one hinge 26 on which at least one member 25 is disposed. Process chamber 15 also includes at least one particle isolator 40 in this embodiment. Some of particles 22 may be moving about process chamber 15 and may not settle into isolation compartment 24. Particle isolator 40 may catch or attract particles 22, even if particles 22 are moving.

Particle isolator 40 may be, for example, an electrostatic sheet or a polymer sheet. Other forms of particle isolator 40 known to those skilled in the art that substantially retain particles 22 may be used and particle isolator 40 is not limited to those listed. Process chamber 15 may include just one particle isolator 40, but also may include a plurality of particle isolators 40 as seen in FIG. 15. If process chamber 15 contains a plurality of particle isolators 40, then these may be either all of one type of particle isolator, or may be a combination of different types of particle isolators.

Each particle isolator 40 is found on particle isolator surface 41 at the base of isolation compartment 24. However, as seen in this embodiment, isolation compartment 24 also may include side particle isolator 42 or top particle isolator 43. Top particle isolator may be disposed on surface 23, opposite of particle isolator surface 41. Particle isolator 40 also may be disposed on surface 23 within chamber 21, member 25, walls 20, or other parts of process chamber 15.

Particle isolator surface 41 may be, for example, surface 23, walls 20 in chamber 21 or isolation compartment 24, a surface in an isolation compartment 24, a surface on member 25, or other surfaces in process chamber 15, and is not limited solely to the base of process chamber 15 as illustrated in FIG. 15. Particle isolator 40 may be recessed into particle isolator surface 41, as seen in particle isolator 40. Particle isolator 40 also may be disposed on particle isolator surface 41 without being recessed, as seen in side particle isolator 42. Particle isolator 40 also may be raised above particle isolator surface 41 (not illustrated).

In one embodiment, an electrostatic sheet may be used as a particle isolator 40. An electrostatic sheet is, in one embodiment, a polymer sheet with a charged conductive layer. This may be either a positive or negative charge, but is negative in this particular embodiment. This electrostatic sheet is insulated from particle isolator surface 41 or walls 20 by a polymer base material. Electrostatic sheets are not limited solely to polymer sheets with conductive layers and may be other materials capable of holding an electric charge. Electrostatic sheets in this embodiment typically require low current to be applied to them. Electrostatic sheets may also use high voltage power.

Some of particles 22 may be charged, especially if particles 22 originated in an ion beam or plasma. Opposite charges may exist between particles 22 and an electrostatic sheet. Thus, an attractive force may exist between particles 22 and an electrostatic sheet.

Particles 22 may be drawn toward an electrostatic sheet due to electrostatic forces, or other forces. Particles 22 also may be distributed onto an electrostatic sheet due to their own movement or the fluid currents within the process chamber. Particles 22 also may be distributed onto an electrostatic sheet due to particles 22 settling into isolation compartment 24. Particles 22 may become disposed or substantially retained on an electrostatic sheet for other reasons not listed in this embodiment. Particles 22, thus substantially retained, may not be removed from an electrostatic sheet and are not be stirred up during venting.

Electrostatic sheets may be cleaned during preventative maintenance, as an example, or at other times. During cleaning, the electrostatic sheet is removed from isolation compartment 24 and replaced with a new electrostatic sheet. Because electrostatic sheets may be disposable, cleaning time may be reduced.

In another embodiment, a polymer sheet may be used as particle isolator 40. This polymer sheet comprises a silicon rubber or silicon elastomer layer, as examples. Other elastomers, polymers, or rubbers with a high particle sticking coefficient and low outgas in vacuum also may be used. A polymer sheet will remain sticky in vacuum.

Particles 22 may be distributed onto a polymer sheet due to their own movement or the gas currents within the process chamber. Particles 22 also may be distributed onto a polymer sheet due to particles 22 settling down into isolation compartment 24. Particles 22 may become disposed or substantially retained on a polymer sheet for other reasons not listed in this embodiment. Particles 22, thus substantially retained, may not be removed from a polymer sheet and will not be stirred up during venting, Polymer sheets may be cleaned during preventative maintenance, as an example, or at other times. A used polymer sheet may be removed from particle isolator surface 41 and replaced with a new polymer sheet. A polymer sheet also may be replaced at other times than just during preventative maintenance. Because polymer sheets may be disposable, cleaning time may be reduced.

FIG. 16 is a view of an embodiment of the particle isolation system using an evacuation system. This evacuation system is an example of removing particles 22 from isolation compartment 24 and may be known as a vent and rough, or autoclean, routine. Member 25 is in a second position. Particles 22 are substantially blocked from moving from isolation compartment 24 to chamber 21 through opening 27.

Process chamber 15 further includes a vent 71 connected with a fluid source 70. Fluid 74 enters isolation compartment 24 through vent 71. Fluid 74 may be a process gas, such as nitrogen, or may be atmosphere. Fluid 74 also may be any fluid that removes particles 22 from isolation compartment 24 and that may be removed by pump 73.

Vent 71 introduces fluid 74 to isolation compartment 24 by moving vent 71 from a closed position to an open position. The degree vent 71 is opened may vary. Opening of vent 71 need not be substantial, but may be range from slight opening of vent 71 to total opening of vent 71. Fluid 74 is then introduced to isolation compartment 24 in a single burst or in multiple bursts that introduce a series of shockwaves. The amount of fluid 74 introduced may vary based on, for example, the amount of particles 22 in isolation compartment 24.

The introduction of fluid 74 creates a pressure burst which causes particles 22 to move toward evacuation outlet 72. Particles 22 move because particles 22 are large enough for pumping by pump 73 and because of the shockwave caused by the addition of fluid 74 through vent 71 to isolation compartment 24. Particles 22 and fluid 74 are then removed from isolation compartment 24 through evacuation outlet 72. Pump 73 may further remove particles 22 without introduction of fluid 74 due to its evacuation action.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible. Accordingly, the foregoing description is by way of example only and is not intended as limiting.

What is claimed is:

1. A particle isolation system comprising:
    an ion beam generator chamber;
    a gas supply connected to said ion beam generator chamber;
    a mass analyzer downstream of said ion beam generator chamber;
    an end station connected to said mass analyzer;
    a member having at least a first position and a second position;
    an actuator to translate said member between said first position and said second position; and
    at least one isolation compartment within said ion beam generator chamber having a plurality of walls, said isolation compartment defined by said plurality of walls, at least one of said plurality of walls of said isolation compartment defining at least one opening, wherein said member in said first position permits particles to enter said isolation compartment through said opening, and wherein said member in said second position substantially encloses said isolation compartment thereby substantially limiting movement of said particles through said opening.

2. The particle isolation system of claim 1, further comprising an angle corrector magnet, said angle corrector magnet being downstream of said ion beam generator chamber.

3. The particle isolation system of claim 1, wherein said member forms a seal around said opening.

4. The particle isolation system of claim 1, wherein said isolation compartment is smaller than said ion beam generator chamber.

5. The particle isolation system of claim 1, wherein said actuator is selected from the group consisting of an electromechanical actuator, a pneumatic actuator, and a piezo actuator.

6. The particle isolation system of claim 1, further comprising a controller connected to said actuator, said controller configured to control when said member translates between said first position and said second position.

7. A particle isolation system comprising:
    an ion beam generator chamber;
    an ion source in said ion beam generator chamber;
    a gas supply connected to said ion source;
    a mass analyzer downstream of said ion source;
    an end station connected to said mass analyzer;
    a member having at least a first position and a second position;
    an actuator to translate said member between said first position and said second position, said actuator selected from the group consisting of an electromechanical actuator, a pneumatic actuator, and a piezo actuator;
    at least one isolation compartment within said ion beam generator chamber, said isolation compartment defining at least one opening, wherein said member in said second position substantially blocks said opening thereby substantially limiting movement of particles through said opening; and
    a controller connected to said actuator, said controller configured to control when said member translates between said first position and said second position.

8. The particle isolation system of claim 7, further comprising an angle corrector magnet, said angle corrector magnet being downstream of said ion source.

9. The particle isolation system of claim 7, wherein said member forms a seal around said opening.

10. The particle isolation system of claim 7, wherein said isolation compartment is smaller than said ion source.

11. A particle isolation system comprising:
    an ion beam generator chamber;
    an ion source in said ion beam generator chamber;
    a gas supply connected to said ion source;
    a mass analyzer downstream of said ion source;
    an end station connected to said mass analyzer;
    a first isolation compartment and a second isolation compartment within said ion beam generator chamber, said first isolation compartment and said second isolation compartment each defining at least one opening;
    at least two members having at least a first position and a second position, one of said at least two members disposed near each of said first isolation compartment and said second isolation compartment; and
    an actuator to translate at least one of said members between said first position and said second position, wherein each of said members in said first position permits particles to enter one of said first isolation compartment and said second isolation compartment through said opening, and wherein each of said members in said second position substantially blocks said opening thereby substantially limiting movement of said particles through said opening.

12. The particle isolation system of claim 11, further comprising an angle corrector magnet, said angle corrector magnet being downstream of said ion source.

13. The particle isolation system of claim 11, wherein said first isolation compartment and said second isolation compartment are disposed with openings in different surfaces.

14. The particle isolation system of claim 13, wherein said different surfaces are in different planes.

15. The particle isolation system of claim 11, wherein each of said members forms a seal around said opening.

16. The particle isolation system of claim 11, wherein said first isolation compartment and said second isolation compartment are smaller than said ion source.

17. The particle isolation system of claim 11, wherein said actuator is selected from the group consisting of an electromechanical actuator, a pneumatic actuator, and a piezo actuator.

18. The particle isolation system of claim 11, further comprising a controller connected to said actuator, said controller configured to control when each of said members translates between said first position and said second position.

19. The particle isolation system of claim 7, further comprising a suppression electrode and a ground electrode in said ion beam generator chamber, and wherein said ion beam generator chamber is connected to said mass analyzer.

20. The particle isolation system of claim 11, further comprising a suppression electrode and a ground electrode in said ion beam generator chamber, and wherein said ion beam generator chamber is connected to said mass analyzer.

* * * * *